US010628255B1

(12) United States Patent
Steiner et al.

(10) Patent No.: US 10,628,255 B1
(45) Date of Patent: Apr. 21, 2020

(54) MULTI-DIMENSIONAL DECODING

(71) Applicant: Avago Technologies International Sales Pte. Limited, Singapore (SG)

(72) Inventors: Avi Steiner, Kiriat Motzkin (IL); Hanan Weingarten, Herzelia (IL)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 757 days.

(21) Appl. No.: 14/736,772

(22) Filed: Jun. 11, 2015

(51) Int. Cl.
*G06F 11/10* (2006.01)
*H03M 13/09* (2006.01)

(52) U.S. Cl.
CPC ......... *G06F 11/1004* (2013.01); *H03M 13/09* (2013.01)

(58) Field of Classification Search
CPC ........... H03M 13/1105; H03M 13/152; H03M 13/2927; H03M 13/45
See application file for complete search history.

(56) References Cited

U.S. PATENT DOCUMENTS

| 4,430,701 A | 2/1984 | Christian et al. |
| 4,463,375 A | 7/1984 | Macovski |
| 4,584,686 A | 4/1986 | Fritze |
| 4,589,084 A | 5/1986 | Fling et al. |
| 4,777,589 A | 10/1988 | Boettner et al. |
| 4,866,716 A | 9/1989 | Weng |
| 5,003,597 A | 3/1991 | Merkle |
| 5,077,737 A | 12/1991 | Leger et al. |
| 5,297,153 A | 3/1994 | Baggen et al. |
| 5,305,276 A | 4/1994 | Uenoyama |
| 5,592,641 A | 1/1997 | Doyle et al. |
| 5,623,620 A | 4/1997 | Alexis et al. |
| 5,640,529 A | 6/1997 | Hasbun |
| 5,657,332 A | 8/1997 | Auclair et al. |
| 5,663,901 A | 9/1997 | Harari et al. |
| 5,724,538 A | 3/1998 | Morris |
| 5,729,490 A | 3/1998 | Calligaro et al. |
| 5,740,395 A | 4/1998 | Wells |
| 5,745,418 A | 4/1998 | Hu et al. |

(Continued)

FOREIGN PATENT DOCUMENTS

WO   WO2009053963 A2   4/2009

OTHER PUBLICATIONS

Search Report of PCT Patent Application WO 2009/118720 A3, dated Mar. 4, 2010.

(Continued)

*Primary Examiner* — Phung M Chung
(74) *Attorney, Agent, or Firm* — Sheridan Ross P.C.

(57) ABSTRACT

A method for multi-dimensional decoding, the method may include receiving a multi-dimensional encoded codeword that comprises a payload and a redundancy section; wherein the payload comprises data and an error detection process signature; evaluating, during a multi-dimensional decoding process of the multi-dimensional encoded codeword, an hypothesis regarding a content of the payload; applying on the hypotheses an error detection process to provide an indication about a validity of the hypotheses; and proceeding with the multi-dimensional decoding process and finding a next hypothesis to be error detection process validated when the hypothesis is invalid.

18 Claims, 13 Drawing Sheets

(56) References Cited

U.S. PATENT DOCUMENTS

| | | |
|---|---|---|
| 5,778,430 A | 7/1998 | Ish |
| 5,793,774 A | 8/1998 | Usui et al. |
| 5,920,578 A | 7/1999 | Zook et al. |
| 5,926,409 A | 7/1999 | Engh et al. |
| 5,933,368 A | 8/1999 | Hu et al. |
| 5,956,268 A | 9/1999 | Lee |
| 5,956,473 A | 9/1999 | Hu et al. |
| 5,968,198 A | 10/1999 | Balachandran |
| 5,982,659 A | 11/1999 | Irrinki et al. |
| 6,011,741 A | 1/2000 | Harari et al. |
| 6,016,275 A | 1/2000 | Han |
| 6,038,634 A | 3/2000 | Ji et al. |
| 6,081,878 A | 6/2000 | Estakhri |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett |
| 7,388,781 B2 | 6/2008 | Litsyn |
| 7,395,404 B2 | 7/2008 | Gorobets |
| 7,441,067 B2 | 10/2008 | Gorobets et al. |
| 7,443,729 B2 | 10/2008 | Li |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell |
| 7,619,922 B2 | 11/2009 | Li |
| 7,697,326 B2 | 4/2010 | Sommer et al. |
| 7,706,182 B2 | 4/2010 | Shalvi et al. |
| 7,716,538 B2 | 5/2010 | Gonzalez |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,903,684 B2 * | 3/2011 | Lee .................. H04L 47/10 365/230.05 |
| 7,911,848 B2 | 3/2011 | Eun |
| 7,961,797 B1 | 6/2011 | Yang et al. |
| 7,975,192 B2 | 7/2011 | Sommer |
| 8,010,739 B2 * | 8/2011 | Watanabe .......... G06F 11/1441 707/609 |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B1 | 5/2012 | Yang |
| 8,250,324 B2 | 8/2012 | Haas |
| 8,300,823 B2 | 10/2012 | Bojinov |
| 8,305,812 B2 | 11/2012 | Levy |
| 8,327,246 B2 | 12/2012 | Weingarten |
| 8,407,560 B2 | 3/2013 | Ordentlich |
| 8,417,893 B2 | 4/2013 | Khmelnitsky |
| 8,468,431 B2 * | 6/2013 | Steiner .................. H03M 13/09 714/780 |
| 9,397,706 B1 * | 7/2016 | Steiner .............. H03M 13/1105 |
| 9,542,262 B1 * | 1/2017 | Bar .................... G06F 11/1004 |
| 2001/0034815 A1 | 10/2001 | Dugan et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2002/0156988 A1 | 10/2002 | Toyama |
| 2002/0174156 A1 | 11/2002 | Birru |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Lee |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0059768 A1 | 3/2004 | Denk |
| 2004/0080985 A1 | 4/2004 | Chang et al. |
| 2004/0153722 A1 | 8/2004 | Lee |
| 2004/0153817 A1 | 8/2004 | Norman et al. |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima et al. |
| 2006/0101193 A1 | 5/2006 | Murin |
| 2006/0195651 A1 | 8/2006 | Estakhri |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0282411 A1 | 12/2006 | Fagin et al. |
| 2006/0284244 A1 | 12/2006 | Forbes |

(56) References Cited

U.S. PATENT DOCUMENTS

| | | |
|---|---|---|
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |
| 2007/0098069 A1 | 5/2007 | Gordon |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0132755 A1 | 5/2009 | Radke |
| 2009/0027961 A1 | 6/2009 | Park |
| 2009/0144598 A1 | 6/2009 | Yoon |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi |
| 2009/0287930 A1 | 11/2009 | Nagaraja |
| 2009/0300269 A1 | 12/2009 | Radke et al. |
| 2009/0323942 A1 | 12/2009 | Sharon |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0174853 A1 | 7/2010 | Lee |
| 2010/0180073 A1 | 7/2010 | Weingarten et al. |
| 2010/0172179 A1 | 8/2010 | Gorobets et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette |
| 2010/0149881 A1 | 11/2010 | Lee et al. |
| 2010/0293321 A1 | 11/2010 | Weingarten |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang |
| 2011/0209028 A1 | 8/2011 | Post |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1* | 1/2012 | Steiner ............. H03M 13/09 714/758 |
| 2012/0005558 A1 | 1/2012 | Steiner et al. |
| 2012/0005560 A1* | 1/2012 | Steiner ............. H03M 13/09 714/780 |
| 2012/0008401 A1 | 1/2012 | Katz et al. |
| 2012/0008414 A1 | 1/2012 | Katz et al. |
| 2012/0017136 A1 | 1/2012 | Ordentlich et al. |
| 2012/0051144 A1 | 3/2012 | Weingarten et al. |
| 2012/0063227 A1 | 3/2012 | Weingarten et al. |

(56) References Cited

U.S. PATENT DOCUMENTS

| | | |
|---|---|---|
| 2012/0066441 A1 | 3/2012 | Weingarten |
| 2012/0110250 A1 | 5/2012 | Sabbag et al. |
| 2012/0124273 A1 | 5/2012 | Goss et al. |
| 2012/0246391 A1 | 9/2012 | Meir |

OTHER PUBLICATIONS

Search Report of PCT Patent Application WO 2009/095902 A3, dated Mar. 4, 2010.
Search Report of PCT Patent Application WO 2009/078006 A3, dated Mar. 4, 2010.
Search Report of PCT Patent Application WO 2009/074979 A3, dated Mar. 4, 2010.
Search Report of PCT Patent Application WO 2009/074978 A3, dated Mar. 4, 2010.
Search Report of PCT Patent Application WO 2009/072105 A3, dated Mar. 4, 2010.
Search Report of PCT Patent Application WO 2009/072104 A3, dated Mar. 4, 2010.
Search Report of PCT Patent Application WO 2009/072103 A3, dated Mar. 4, 2010.
Search Report of PCT Patent Application WO 2009/072102 A3, dated Mar. 4, 2010.
Search Report of PCT Patent Application WO 2009/072101 A3, dated Mar. 4, 2010.
Search Report of PCT Patent Application WO 2009/072100 A3, dated Mar. 4, 2010.
Search Report of PCT Patent Application WO 2009/053963 A3, dated Mar. 4, 2010.
Search Report of PCT Patent Application WO 2009/053962 A3, dated Mar. 4, 2010.
Search Report of PCT Patent Application WO 2009/053961 A3, dated Mar. 4, 2010.
Search Report of PCT Patent Application WO 2009/037697 A3, dated Mar. 4, 2010.
Yani Chen, Keshab K. Parhi, "Small Area Parallel Chien Search Architectures for Long BCH Codes", Ieee Transactions On Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-72 vol. 2.
Michael Purser, "Introduction To Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips. com), Oct. 2005.

Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions On Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built In Self Diagnosis", ITC International Test Conference, Paper 2.1, Feb. 2005.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com , 2005.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26, Dec. 2007.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

PRIOR ART

PRIOR ART

MULTI-DIMENSIONAL DECODING

BACKGROUND

There is a growing need to decode information that was subjected to one or more error inducing processes such as a writing process or a read process during which information was stored in a flash memory module and then read from the flash memory module.

SUMMARY

There are provided systems, methods and non-transitory computer readable media for decoding one or more component codes, as illustrated in the claims.

According to an embodiment of the invention there may be provided a method for multi-dimensional decoding, the method may include receiving a multi-dimensional encoded codeword that may include a payload and a redundancy section; wherein the payload may include data and an error detection process signature; evaluating, during a multi-dimensional decoding process of the multi-dimensional encoded codeword, an hypothesis regarding a content of the payload; applying on the hypotheses an error detection process to provide an indication about a validity of the hypotheses; and proceeding with the multi-dimensional decoding process and finding a next hypothesis to be error detection process validated when the hypothesis may be invalid.

The method may include providing the hypothesis as an outcome of the multi-dimensional decoding process when the hypothesis may be valid.

The method may include determining whether to provide the hypothesis as an outcome of the multi-dimensional decoding process when the hypothesis may be valid.

The hypothesis regarding the content of the payload may be evaluated during a decoding of a code component of a dimension of the multi-dimensional decoding process; wherein multiple code components are associated with the dimension; wherein the determining of whether to provide the hypothesis as the outcome of the multi-dimensional decoding may be responsive to a number of resolved code components of the multiple code components.

The error detection process may be a cyclic redundancy check (CRC) process.

The method may include calculating an initial error detection field process of the received payload; and updating the initial error detection field with an update of the content of the payload during the multi-dimensional decoding process.

The method may include skipping an applying of an error detection process on a hypothesis when the multi-dimensional decoding process indicates that a content of a payload associated with the hypothesis includes miss-corrected bits.

The multi-dimensional decoding process may include soft decoding.

The method may include applying on a majority of hypotheses evaluated during the multi-dimensional decoding process, the error detection process to provide indications about validities of the majority of the hypotheses.

The multi-dimensional decoding process may include hard decoding.

The hypothesis regarding the content of the payload may be obtained by flipping a bit of a code component; wherein the code component may be associated with a dimension of the multi-dimensional decoding process; wherein an intersection between the code component and at least one further code component of at least one further dimension may include a shared bit; wherein the code component and the further code component were flagged as being erroneous before flipping the bit of the intersection.

The payload may include multiple error detection process signatures and multiple data segments; wherein each data segment may be associated with an error detection process signature.

The method may include preventing a change of bits of a data segment after applying the error detection process on the data segment and finding that the data segment may be valid.

The method may include rejecting a hypothesis regarding the content of the payload when the hypothesis conflicts with a content of the data segment after finding that the data segment may be valid.

The method may include increasing a reliability score of bits of a data segment after applying the error detection process on the data segment and finding that the data segment may be valid.

The method may include receiving an instruction to ignore an invalidity of a certain data segment; and determining to provide the hypothesis as the outcome of the multi-dimensional decoding process when payloads segments that differ from the certain data segment are valid. The instruction can be sent to a memory controller from a user.

The method may include receiving an instruction to ignore invalidity of a certain data segment; and determining whether to provide the hypothesis as the outcome of the multi-dimensional decoding process when payloads segments that differ from the certain data segment are valid.

The method may include receiving an instruction to respond to a validity of only certain data segments; and determining to provide the hypothesis as the outcome of the multi-dimensional decoding process when the certain payloads segments are valid.

The method may include receiving an instruction to respond to a validity of only certain data segments; and providing the hypothesis as the outcome of the multi-dimensional decoding process when the certain payloads segments are valid.

According to an embodiment of the invention there may be provided a non-transitory computer readable medium that may store instructions that once executed by a flash memory controller cause the flash memory controller to receive a multi-dimensional encoded codeword that may include a payload and a redundancy section; wherein the payload may include data and an error detection process signature; evaluate, during a multi-dimensional decoding process of the multi-dimensional encoded codeword, an hypothesis regarding a content of the payload; apply on the hypotheses an error detection process to provide an indication about a validity of the hypotheses; proceed with the multi-dimensional decoding process and find a next hypothesis to be error detection process validated when the hypothesis may be invalid.

According to an embodiment of the invention there may be provided a flash memory controller that may include a memory and a processor, wherein the memory may be configured to store a multi-dimensional encoded codeword that may include a payload and a redundancy section; wherein the payload may include data and an error detection process signature; wherein the processor may be configured to evaluate, during a multi-dimensional decoding process of the multi-dimensional encoded codeword, an hypothesis regarding a content of the payload; apply on the hypotheses an error detection process to provide an indication about a validity of the hypotheses; proceed with the multi-dimensional decoding process and find a next hypothesis to be error detection process validated when the hypothesis may be invalid.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

Figure 1:
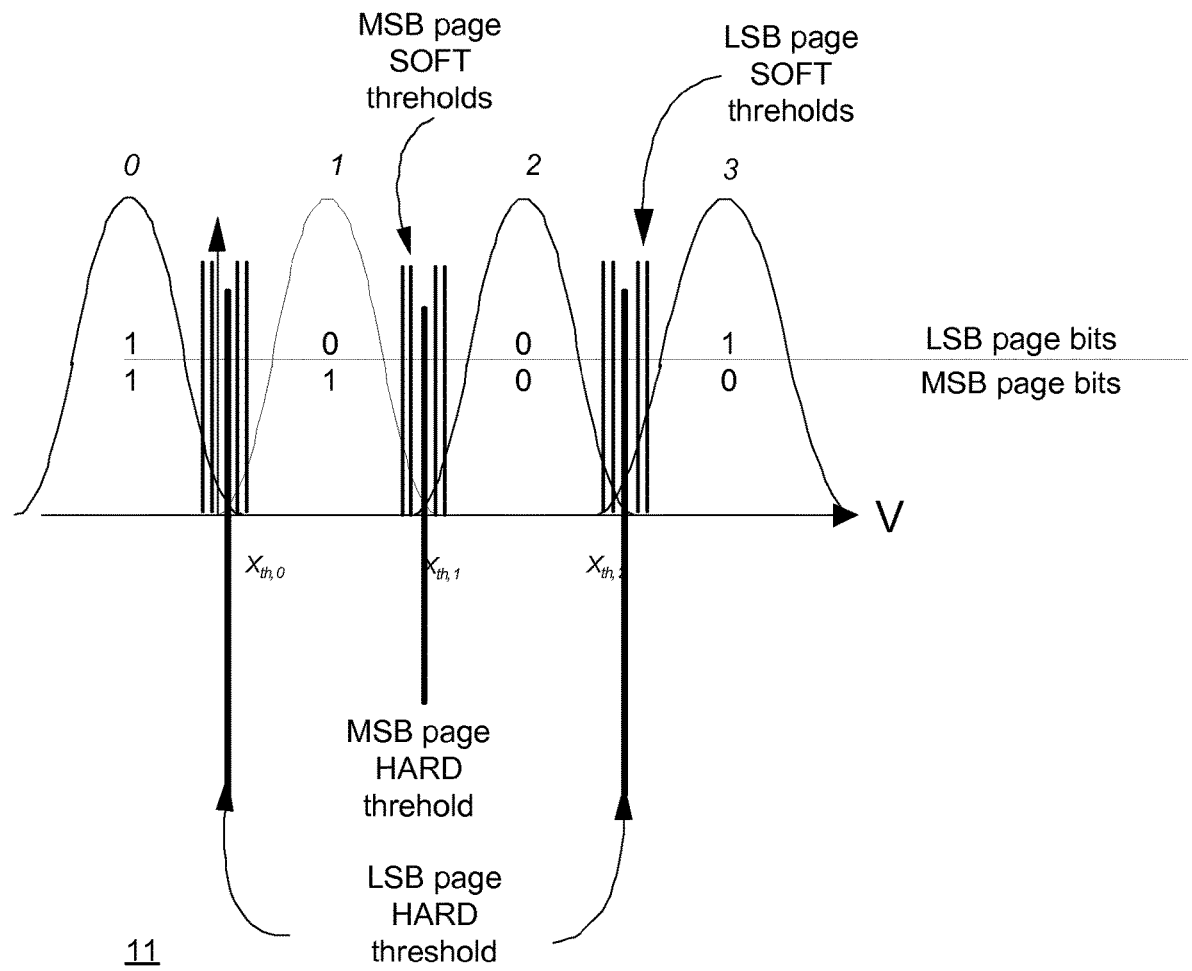
FIG. 1 illustrates a prior art threshold voltage distribution.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

The terms "component code", and "packet" are used in an interchangeable manner. Multiple component codes form a codeword. A component code may be regarded as an atomic unit for decoding and encoding.

In the following text there is a reference to cyclic redundancy check (CRC). It is noted that CRC is merely an example of an error detection process.

Log likelihood ratio (LLR) is a non-limiting of a reliability attribute. It compares between the probabilities of two hypotheses. For example, an LLR of a bit is the relationship between the probability that the bit set and a probability that the bit is reset. LLR of a set of bits or of a component code may be a function of the LLRs of the bits that form the set of bits or the component code respectively. For example—an LLR of a set of bits may be the sum of the LLRs of the bits that form the set of bits. An absolute value of an LLR is denoted |LLR|.

Various coding and encoding schemes are illustrated in the following patents and patent applications—all being incorporated herein by reference U.S. Pat. Nos. 8,341,502, 8,700,970, 8,510,639, 8,458,574, 8,621,321, 8,850,297, U.S. patent application Ser. Nos. 14/293,721, 14/049,070, 14/049,547 and 13/917,069.

In these patents algorithms corresponding to construction of multi-dimensional codes were presented, along with algorithms for hard decoding, when information of a single bit resolution is available at the decoder. Furthermore, a soft decoder was presented, with several low complexity decoding algorithms, and an exemplary hardware architecture.

Multi-dimensional codes are widely used due to their potential efficiency. It is usually impractical to implement optimal decoding in the sense of maximal probability per information bit, such as maximum likelihood (ML) decoding, since the complexity may grow rapidly. To approximate the performance of ML decoding, it is proposed to perform a sub-optimal linear complexity decoding. The method is mainly suitable, but not limited, to concatenated multi-dimensional Bose-Chaudhuri-Hocquengham (BCH) codes.

In multi-dimensional codes which are obtained from small component codes, the decoding status of each component code has a limited reliability. In order to overcome this limitation, an error detection signature may be added to the data and may be included in the codeword in order to increase the decoding success status reliability.

The codeword may include a payload section and a redundancy section. The payload may include the data and a Cyclic Redundancy Check (CRC) signature.

The data may be deemed valid if the codeword has been successfully reconstructed and the CRC signature matches a CRC value calculated by processing the decoded payload.

Single-dimensional or multi-dimensional decoding include single/multi code components. In some cases failures of decoding of the single code/component code may be mitigated when the CRC error detection mechanism detects no errors. This is since the decoder output usually consists of the payload bits only. This motivates utilization of CRC error detection in the decoding process, via low complexity methods, to overcome rare event of decoding which does not succeed, due to few remaining errors in payload and maybe multiple errors in redundancy.

Various embodiments of the invention relate to hard decoding and soft decoding, where the iterative decoding of multi-dimensional codes cannot efficiently recover certain error patterns, the CRC signature is used to locally enable detection of remaining errors.

NAND Flash Read Background

FIG. 1 demonstrates a voltage threshold distribution 11 of a multi-level cell (MLC) flash memory. The most significant bit (MSB) page type can read with a single threshold when the number of errors is sufficiently low. Otherwise, if the ECC cannot correct the errors using a single read, a digital signal processing (DSP) unit may perform multiple reads to obtain soft information at the decoder input. The soft information may be obtained by reading for example at the designated thresholds around the hard input threshold. From the multiple reads the soft information may be computed, in the form of log-likelihood ratio (LLR). For reading the least significant bits (LSB) stored on same row, the decoder reads using two thresholds, defined as LSB page hard thresholds in FIG. 1. If hard decoding cannot be successfully completed due to high error rate, the decoder may be provided by soft information obtained from multiple reads in a similar form as described for the MSB pages. The methods that are considered in this application are suitable for both hard and soft decoding of the encoded flash data.

CRC within a Codeword—Overview

Systematic codes consist of a payload section and a redundancy section. The payload may include the data and a Cyclic Redundancy Check (CRC) signature.

Figure 2:
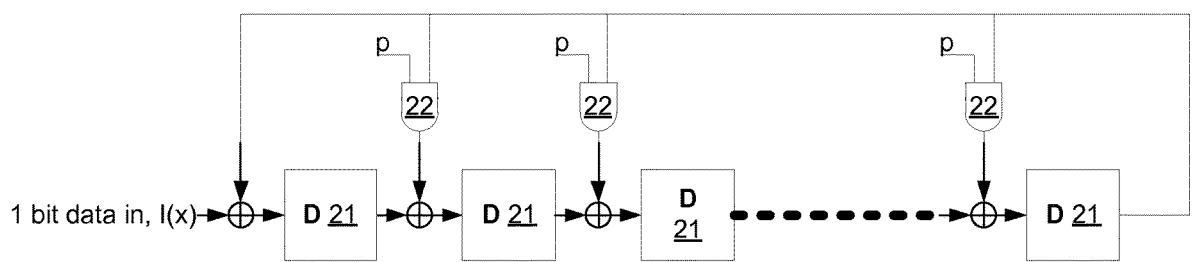
FIG. 2 illustrates a prior art CRC calculation circuit.

FIG. 2 exemplifies a CRC computation circuit 20 that includes an alternating sequence of delay units 21 and adders 22. An adder 22 is positioned before each delay unit 21. The first adder is fed by a bit of data and a feedback signal from the last delay unit 21. Other adders are positioned between a pair of delay units 21 and are also fed by an AND gate 22. Each AND gate is fed by the feedback signal and an additional signal p. The delay units 21 form a shift register in which data is CRC processed. The polynomial which defines the signature computation is denoted by P(x), at the inputs to the CRC computation register.

The basic equation of the CRC computation performed is: G(x)=I(x)mod(P(x))

Where G(x) is the content of the CRC's memory-elements, I(x) is the input polynomial and P(x) is the feedback polynomial which is constant for each particular CRC circuit, and the CRC value i.e. G(x) is usually appended to the payload data.

As may be noticed, for computing G(x) during decoding, all payload input is required, which means that its computation complexity is O(N) where N is the codeword length. When the CRC's polynomial P(x) is a generator polynomial of a GF($2^q$) finite field, it may be possible to compute updates of G(x) rather efficiently for a given bit change in the payload. This is required during decoding as the decoder attempts to detect the errors and upon CRC signature matching and other stopping conditions terminate the decoding.

If the CRC is to be used for testing error hypothesis, it is plausible that the CRC signature update for every error-bit hypothesis will be efficient. This is possible according to U.S. Pat. No. 8,510,639. Since in a finite GF($2^q$) field all the elements are generated by $(\alpha^n) \bmod(p(x))$ where $\alpha$ is the primitive element in that field we can write that any polynomial $m(\alpha)$ that has all its coefficients equal to 0 beside a single coefficient at bit J which is equal to 1 as $m(\alpha)=\alpha^J$. $m(\alpha)$ corresponds to an error vector with an error at bit J.

Figure 3:
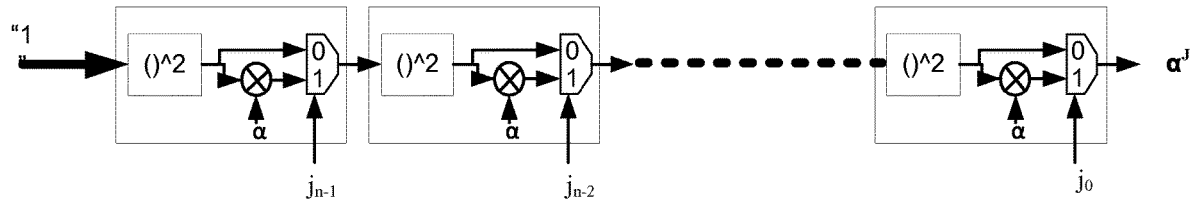
FIG. 3 illustrates a prior art CRC update circuit.
Figure 3:
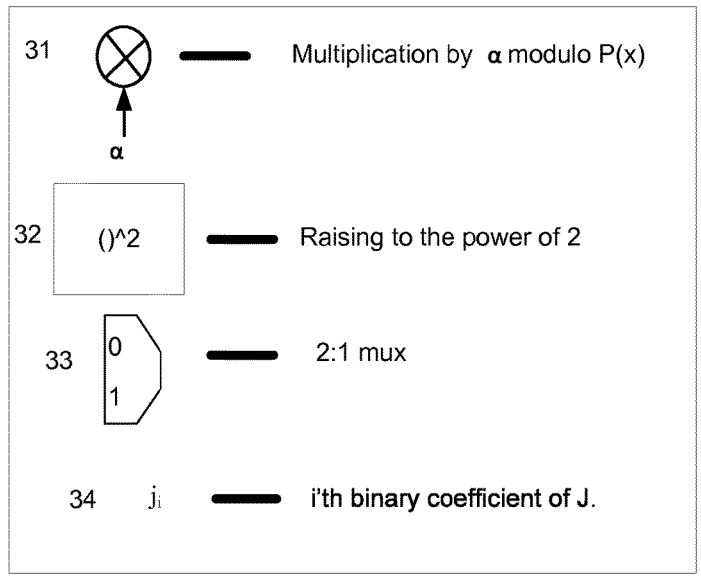

From the above it is clear that computing the CRC values that need to be added to the imperfect CRC (i.e. computed with the data before error correction) for each bit error (or bit flip) bit J is simply computing $(\alpha^J) \bmod(p)$. Since as it is well known and for example well explained in "Bit Serial Systolic Architectures for Multiplicative Inversion and Division over GF($2^m$)", Amir K. Daneshbeh, Waterloo, Ontario, Canada, 2005. The error bit J can be written as a binary (GF(2)) polynomial $J=j_{n-1}2^{n-1}+j_{n-2}2^{n-2}+\ldots j_0$ which suggests an easy and efficient implementation for computing $(\alpha^n) \bmod(p(x))$ as depicted in FIG. 3. The circuit of FIG. 3 includes a sequence of units. The input port of each unit is an input of a raising by power of two block 32 that feeds its output to a multiplier 31 by factor $\alpha$ and to a first input of 2:1 multiplexer 33. The output of the multiplier is connected to the second input of the 2:1 multiplexer 33. In the i'th unit of the sequence a i'th binary coefficient of J selects the input port of the 2:1 multiplexer to be outputted as an output signal of the i'th unit.

This enables computing an initial CRC signature on the decoder input with O(N) complexity, and then for every error bit hypothesis update the CRC signature at O(1) until the CRC matches and it is possible to declare a decoding success.

Multi-Dimensional Encoding Overview

In multi-dimensional encoding, a stream of information bits is passed through the set of multiple component encoders, which together encode the full payload into a single codeword. It is well known [e.g. "Introduction to coding theory," Ron M. Roth, and "Algebraic Codes for Data Transmission," Richard E. Blahut] that BCH encoding may be done by using a shift register through which the systematic data is passed. Therefore, the data simply passes through a component encoder without being modified while the shift-register advances. When the systematic data of the code completely passed through the shift-register, the content of the shift register is the redundancy of the code component and is appended to the data stream. This principle works for all component encoders in all dimensions.

Figure 4:
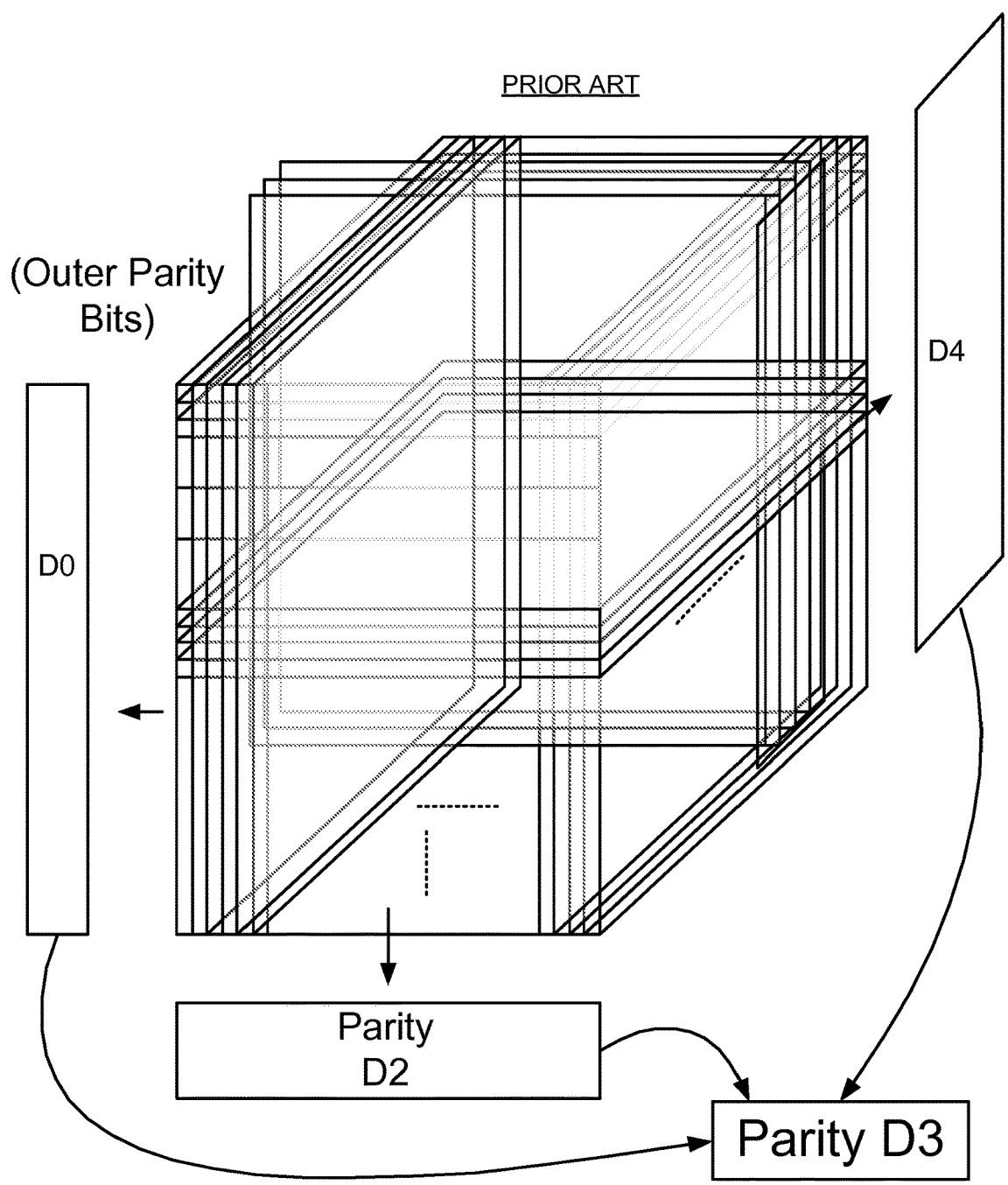
FIG. 4 illustrates a prior art three dimensional folded BCH encoding.

FIG. 4 depicts a prior art multi-dimensional encoded codeword 40, where encoding is performed in three dimensions. The multi-dimensional encoded codeword 40 is represented by a three dimensional cube, and every set of planes represents a set of information bits used by a component code encoder. The dimensionality refers to the direction from where the planes are selected, creating parity D0, parity D1 and parity D2, optionally, an additional code may encode the parity bits creating parity D3 bits. All together these bits provide a systematic codeword.

Figure 5:
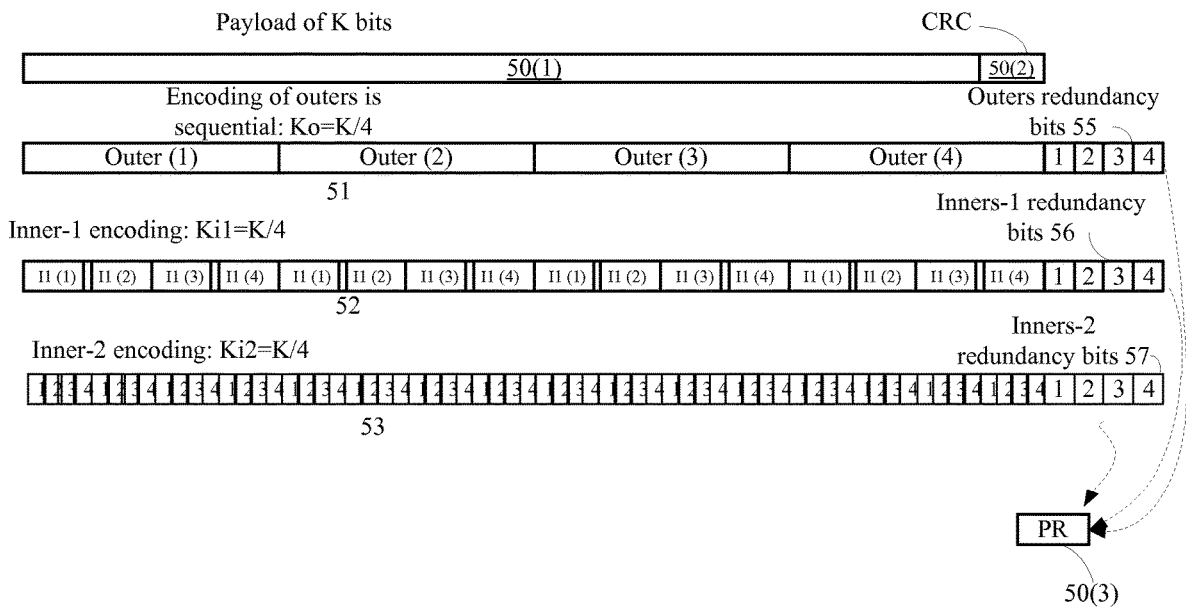
FIG. 5 illustrates a prior art three dimensional folded BCH encoding wherein a K-bit payload includes a single CRC signature.

FIG. 5 provides another schematic description of a three dimensional encoder, where the upper part represents a payload 50(1) of K data bits, and the CRC signature 50(2) computed from these K data bits. The encoding of each dimension is illustrated right below. The first dimension 51 is an outer code dimension, where four equal portions of the payload are taken directly from the K data bits one after the other. The first dimension 51 includes outer redundancy bits 55. For every portion the same component encoder is used for generating it redundancy, Outer(1) generates outer redundancy bits (1), etc. For a second dimension 52, the same K-input bits are divided into 4 equal portions as well, and encoded again with the same component encoder. However, every portion captures another part of the K input bits, which effectively have only K/16 overlapping bits of any two code of current (Inner-1) and previous dimension (Outer). This dimension is called Inner-1, and for the payload denoted by M0 the component encoder generates redundancy (1), etc. The second dimension 52 includes Inner-1 redundancy bits 56. The third dimension here is called Inner-2. For its encoding, the same K-input bits are divided into 4 equal portions as well, and encoded again with the same component encoder. However, every portion captures another part of the K input bits, such that only K/64 input bits will be common to any set of component codes from different dimensions, an example for a set is {Outer(2), I1(4), I2(3)}. The third dimension 53 includes Inner-2 redundancy bits 57.

Finally, there is a last encoding stage of the redundancy of all dimensions, called Parity encoder, which generates PR 50(3), the parity redundancy bits.

Multi-Dimensional Encoding with Multiple CRC Signatures

Figure 6:
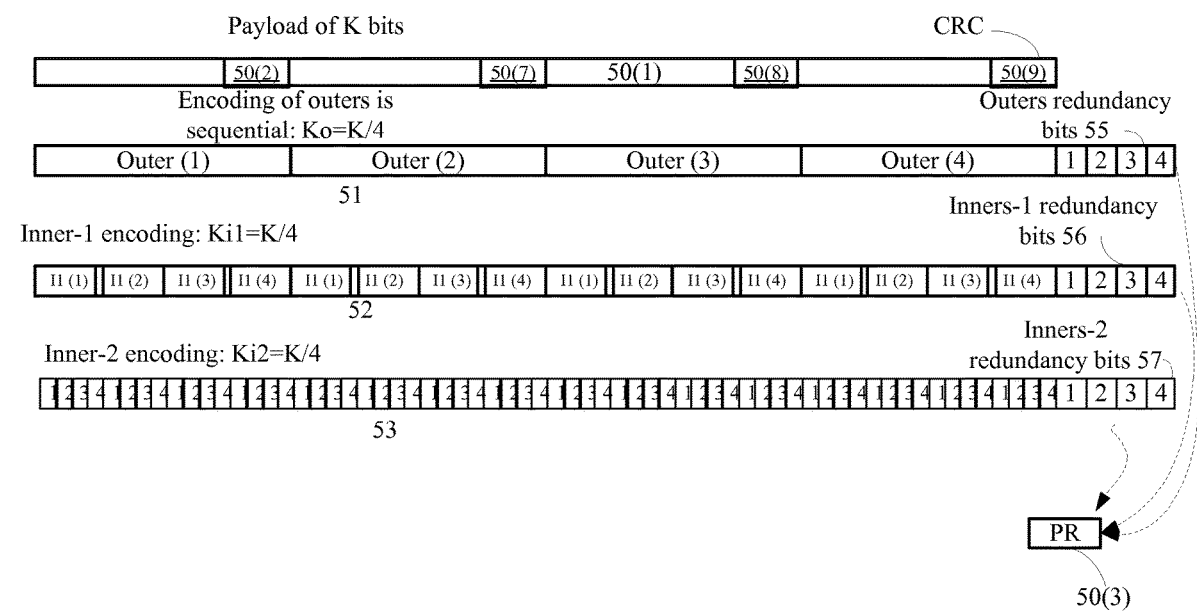
FIG. 6 illustrates a prior art three dimensional folded BCH encoding wherein a K-bit payload includes four CRC signatures and four segments.

Another embodiment of the invention includes encoding includes multiple CRC signatures on different portions of the payload. The method includes separating the input payload for encoding into N-portions (data segments). The portions do not have to be in equal size, each portion may include an independent application data. For example, each data portion can be a sector of 512Bytes. For each portion a CRC signature is computed, and is used for interleaving and encoding. This method allows a Flash memory controller to read part of the data and part of the redundancy and try to perform decoding for such single sector. If this fails the decoder can read the whole codeword and once successfully decoded, it may output the desired portion of data. In FIG. 6 there are four CRC signatures 50(2), 50(7), 50(8) and 50(9) that are computed on four different payload segments.

FIG. 6 schematically illustrates a payload with multiple CRC signatures where each signature corresponds to its preceding input bits. The outer code components in this diagram are responsive to the signatures.

Figure 7:
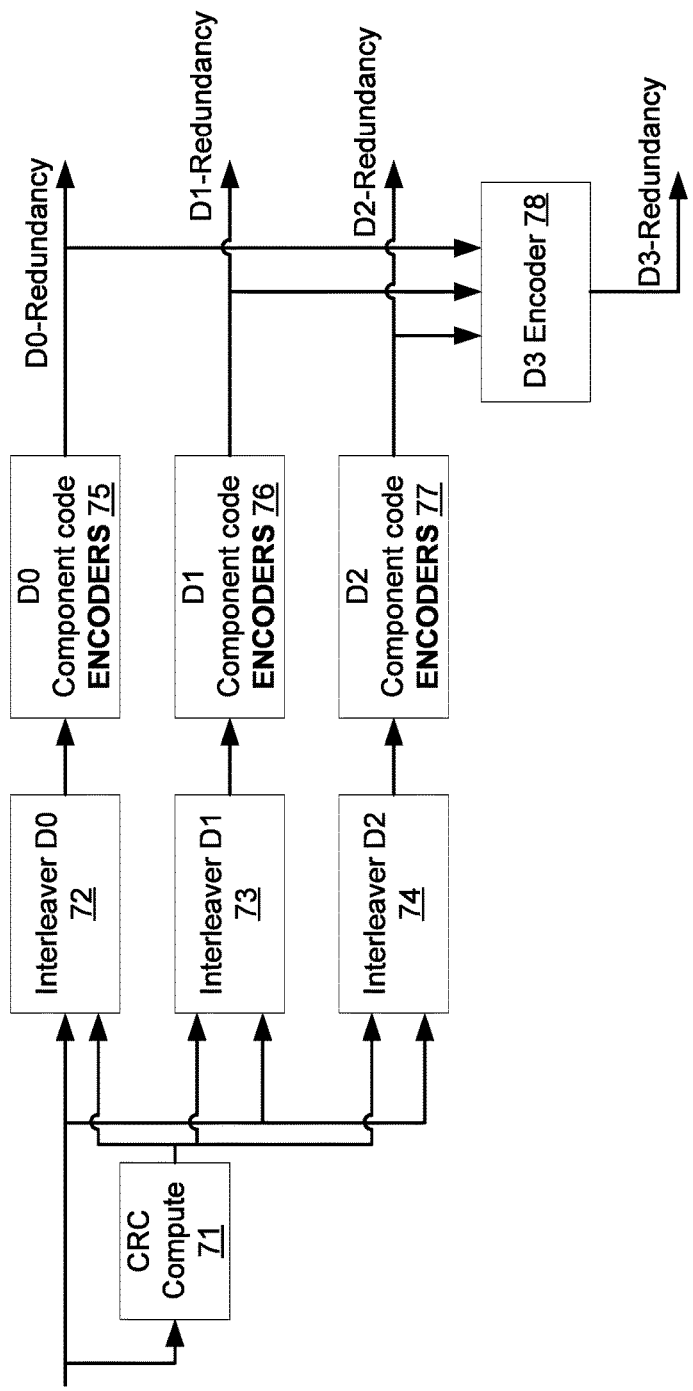
FIG. 7 illustrates multi-dimensional encoding, which includes CRC signature computation on a payload, or multiple signatures on different segments of the payload, according to an embodiment of the invention.

The encoding flow which includes the encoding of each dimension and computation of the CRC signature is illustrated in FIG. 7. Input data is fed to CRC computation module 71 and to each one of interleaver D0 72, interleaver D1 73 and interleaver D2 74. The interleaver of each dimension stands for the re-ordering of the data, which includes also the CRC signature for encoding with the code components of every dimension. The output of the CRC computation module 71 is fed to interleaver D0 72, interleaver D1 73 and interleaver D2 74. The outputs of interleaver D0 72, interleaver D1 73 and interleaver D2 74 are fed to D0 component code encoders 75, D1 component code encoders 76 and D2 component code encoders 77, respectively.

D0 component code encoders 75, D1 component code encoders 76 and D2 component code encoders 77 output D0 redundancy, D1 redundancy and D2 redundancy, respectively (for example outer redundancy bits 55, Inners-1 redundancy bits 56 and Inner-2 redundancy bits 57 of FIGS. 5 and 6). D0 redundancy, D1 redundancy and D2 redundancy are also fed to D3 encoder 78 for generating D3 redundancy (for example PR 50(3) of FIG. 6).

Multi-Dimensional Hard Decoding Overview

The multi-dimensional hard decoding part of the invention assumes that the multi-dimensional codes underhand correspond to multi-dimensional folded codes with encoding scheme as disclosed in U.S. Pat. No. 8,458,574.

Figure 8:
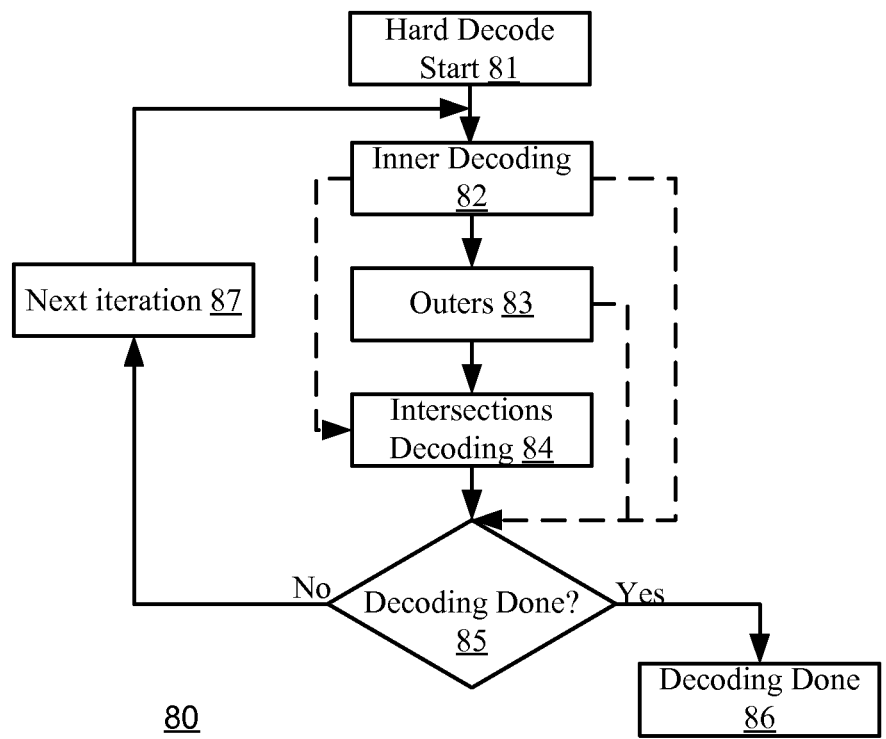
FIG. 8 illustrates multi-dimensional hard decoding.

FIG. 8 describes the basic flow of the multi-dimensional iterative hard decoder. A basic iteration includes attempting to decode all the component codes, at each dimension. The process 80 may start 81. At the first iteration decoding may start with inner codes (inner decoding 83) which might have fast decoding capabilities and if decoding succeeds without outer and intersections decoding, the decoder may complete the decoding within a very short latency. The first several iterations may include inners decoding only, followed by outers decoding (outers 83) if required, which may be followed by intersections decoding (intersections decoding 84).

At the end of the decoding steps the method proceeds to step 85 of checking if the iterations are done. If yes—ending the decoding (decoding done 86), else performing a next iteration (87). Step 87 is followed by step 82.

On some cases during the hard iterative decoding it may be beneficial to perform a complexity limited intersections decoding. A possible scenario for using intersections decoding is when there are still some decoder packets (or component codes) which are not solved, and there was no progress of the hard iterative decoding.

An exemplary intersection bit-set is the information bits associated with multiple distinct packets of different dimensions. The more packets used in every dimension, the smaller is the bit-set of intersection. For multi-dimensional folded BCH codes, the intersection bit-set length may change, as the component codes on the same dimension may differ in their length.

The main steps of intersections decoding include: (I) Mapping of bit-sets which are obtained by intersections of non-solved packets on different dimensions; The bit-sets may contains several intersections of multiple packets of a single dimension; (II) Limit the intersections bit-sets list size; (III) Determine the dimensions for which decoding is to be applied; (IV) Determine the number of bits for enumeration (Nb)—this specifies the enumeration complexity. (V) For every selected intersection set enumerate over the intersection bits, where every time another bit (or bits) is (are) inverted, and attempt decoding the corresponding component codes on the selected dimensions. This enables correcting up to t+Nb errors for a single component code. (VI) Accept the inversion of Nb bits (of an intersection bit-set) if the number of successfully solved packets exceeds some threshold.

Using the results of outer decoding and intersections' decoding, and if decoding did not succeed yet, another iteration is performed by performing further inner decoding iterations.

Soft Decoding Overview

Soft decoding relates to the decoding using soft input information, and providing hard output associated with the corrected information bits.

For soft decoding of a BCH component code (also termed as packet) soft information per bit is required. This is obtained by performing multiple reads from the Flash, where each read operation uses different read thresholds. The read thresholds must be configured such that soft metrics, called LLR, can be computed per bit.

The definition of an LLR is:

$$LLR(b_i) = \log\left(\frac{P(b_i = 1)}{P(b_i = 0)}\right) \quad (1)$$

where $b_i$ is the i-th bit of some page.

The LLR expression can be substantially simplified, for an additive white Gaussian noise (AWGN) channel model. The AWGN is also a good approximation in many cases for the Flash voltage threshold distribution.

By assuming an AWGN channel, $$P(b_i \mid y) = \frac{1}{\sqrt{2\pi\sigma^2}} \exp\left(-\frac{(y - b_i)^2}{2\sigma^2}\right) \quad (2)$$

where y is the AWGN channel output. It is straightforward to show that the LLR($b_i$) becomes $$LLR(b_i) = \frac{2y}{\sigma^2} \quad (3)$$

Where the LLR per bit is created during the multiple Flash reads, as a quantized version of an AWGN channel. The quantization level per threshold is directly determined by the number of reads, as the base-two logarithm of the read counter. Once, the multiple reads have been performed, and LLRs are available for all codeword bits, the decoding process may begin.

Iterative soft decoding includes the process of performing soft decoding on some of the code components, and applying the most likely corrections (under different conditions, as will be elaborated here). On some code components it may be desired to perform only hard decoding. An example for such code can be a 3D code where the outer components are BCH codes which correct t≥2 errors. If this code has inner-1 and inner-2 BCH components with decoding capability of t≤4, then soft decoding may be efficiently implemented here (in terms of computational complexity, and hardware implementation).

Soft Decoding of a Single Component Code

Soft decoding of a single component code may consist of the following main steps: (I) Sort component indices from the least reliable to the $N^{th}$ least reliable bit. The least reliable bits may be those having lowest |LLR($b_i$)|, i.e. lower absolute value LLR. (II) Choose error bits' hypotheses according to minimal sum LLR from within the sorted indices. (III) For every hypothesis, perform hard decoding. (IV) For every hypothesis with a valid hard decoding solution (i.e. miss-correction=0), compute $$\text{score} = \sum_{i \in Hyp} |LLR(b_i)|$$

where Hyp corresponds to the group of inverted bits and the hard decoding solution indices. These together suggest a decoding hypothesis. (V) Save the solution with the lowest score as the most likely candidate, and save also the second best hypothesis, with the second lowest score.

For efficiently decoding a BCH component code a decoding engine may include a syndrome update module, which is performed according to the error hypothesis, then for codes with t≤4 the error locating polynomial (ELP) may be efficiently generated, and the ELP may also be efficiently solved [C. Chen, "Formulas for the Solutions of Quadratic Equations over GF(2m)", IEEE Trans. On Information Theory, vol. 28, no. 5, 1982]. In case the decoding is successful (i.e. missCorrection=0) for a certain hypothesis, the sum-LLR, as in (4), is computed, and a decision on whether or not to apply the correction can be made by the decoder. Conditions for applying the soft suggested corrections are disclosed here.

The process described above is done over a set of pre-defined hypotheses, and usually the hypothesis with the lowest score is considered as the most likely valid correction. This correction will be implemented in case it complies with several conditions as will be described next. In cases where many errors exist, the nearest valid codeword in the sense of minimal score as computed in (4) may be a false correction. In order to reduce probability of accepting false corrections, an iterative decoding process is used, where after each dimension decoding, only a subset of suggested correction hypotheses are accepted. The subset is determined by the more likely hypotheses, e.g. those with a minimal score as computed in (4), out of all component codes that were processed in the current dimension. These selected corrections are implemented, and then soft decoding on the other dimension is done, by repeating the same steps described above. Some of the steps were already introduced in U.S. Pat. Nos. 8,458,574 and 8,700,970 for soft decoding of multi-dimensional codes.

In order to create a meaningful impact of every accepted correction during the per component decoding, the decoder may use a mechanism of LLR clipping, which changes to values of the LLRs within the corrected component code to a maximal value, such that the soft decoder of other components is not likely to change any of the bits which belong to an already corrected component code, like introduced in U.S. Pat. Nos. 8,458,574 and 8,700,970.

Hard Decoding with CRC Error Detection

According to an embodiment of this invention, the hard decoding flow includes a CRC update for every suspected erroneous bit. The CRC signature is once computed on the decoder input at O(N), and then is updated at O(1) for very suspected error. The main advantage of using a CRC during the decoding process for every suspected error-bit is the capability to declare on decode-success without correcting all errors—this is useful in many applications, where the decoding result needed by the application is only the payload, and the decoding can be considered successful despite possible remaining errors in the redundancy.

Another embodiment of the invention consists of a decoder flow with a CRC match test for every suspected error bit during the decoding, whether it is during the inner iterations decoding or during outer decode, or even during intersections' decoding.

Figure 9:
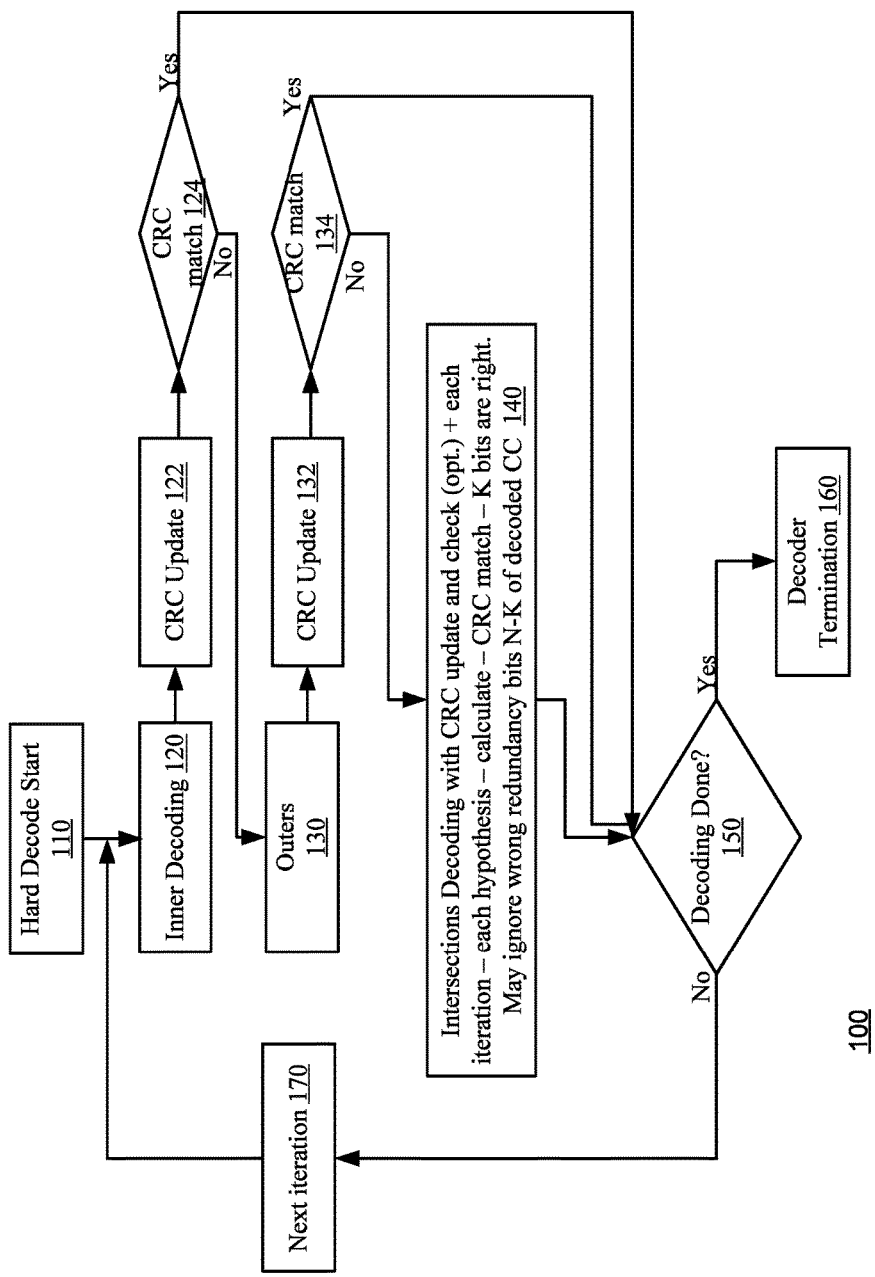
FIG. 9 illustrates a hard decoding flow with CRC updates for suspected errornous bits within the decoding flow, according to an embodiment of the invention.

FIG. 9 exemplifies a multi-dimensional decoding flow 100, which starts at step 110. Then the process continues to inner packets decoding 120, followed by CRC update 122 and step 122 is followed by checking if there is a CRC match 124.

If there is a CRC match then a decoding termination may be tested (step 150 of checking if the decoding is done). If the decoding is done jumping to step 160 of decoder termination. If the decoding is not done jumping to step 170 of performing a next iteration. Step 170 is followed by step 120.

If step 124 finds that there is no CRC match then step 124 is followed by step 130 of performing an outers decoding (outers 130). Step 130 is followed by CRC update 132 and step 132 is followed by checking if there is a CRC match 124.

If step 124 finds that there is a CRC match then a decoding termination may be tested (step 150 of checking if the decoding is done). If the decoding is done jumping to step 160 of decoder termination. If the decoding is not done jumping to step 170 of performing a next iteration. Step 170 is followed by step 120.

If step 134 finds that there is no CRC match then step 134 is followed by step 140 of intersections decoding where a CRC match may be tested for every bit flip hypothesis (which precedes the solver decoding per code component). This may be done in order to resolve scenarios of multiple redundancy errors, which cannot be solved by the code component decoder and by enumeration over the intersected bits (with other unsolved component codes) with a CRC match test, the remaining errors within the intersection may be resolved. This is why before every solving of a flip hypothesis the CRC match test is used.

It is noted that if during step 120 multiple hypotheses are evaluated then the CRC update 122 and the CRC match 124 may be evaluated for a single hypothesis, per some of the hypotheses or for all of the hypotheses. According to an embodiment of the invention CRC update 122 and the CRC match 124 may be applied for every decoding hypothesis in step 120 (of every packet in current dimension), where a decoding hypothesis may comprise of a suggested bit flip, or multiple bit flips.

It is noted that if during step 130 multiple hypotheses are evaluated then the CRC update 132 and the CRC match 134 may be evaluated for a single hypothesis, per some of the hypotheses or for all of the hypotheses. According to an embodiment of the invention once the CRC match is found the non-applied hypotheses may be dropped, and the decoding flow may continue to step 150.

According to another embodiment of this invention, when a CRC match is found, a decoding success is likely. To provide a reliable indication of decoding success (during step 150), it is possible to combine the CRC match indication with a comparison of a zero syndrome counter to a threshold:

$$TH_S \leq |\{x \in D_1, D_2, D_3, s.t. \ S(x)=0\}|$$

If the number of solved code components (packets) on all code dimensions D1,D2,D3 (or per a certain dimension) in this example is greater than THs, then if a CRC match was found a highly reliable decoder success indication may be provided. As said, in systematic codes it is not always required to succeed detecting and correcting all errors, it may be enough to provide only the decoded information bits (required for output) with sufficiently low miss-detection probability.

According to an embodiment of this invention, CRC update and check may be used during intersections decoding, and detect potential errors even if tested component codes are not solved. The flipping of bits within intersections which is followed by associated component codes decoding in each dimension is done alongside with CRC check for every flip, this is even though the flipped bits might not solve the corresponding packets. At the event that the CRC match is detected, a decoder success is tested, as described above.

According to another embodiment of the invention, the intersections' decoding may include multiple joint intersections, namely a plurality of unsolved codes in each dimension, for which the decoder enumerates over the intersecting bits, and attempts to decode component codes during enumeration. The decoder checks the CRC match for all bit flips, and component decoding result, and if CRC match is detected, a decoder success is tested, as described above.

According to another embodiment of the invention, a codeword may include multiple CRC signatures, on different and non-overlapping parts (data segments) of the payload. See, for example the four CRC signatures of FIG. 6. In case there is more than one CRC signature, all CRC signatures are updated during decoding, where every suspected error-bit is associated with another CRC signature to be updated. Then, in case that one of the CRC signatures comparison yields a CRC match, the corresponding part of the payload may be considered corrected. The ongoing decoding process accounts for the decoded payload portion by rejecting error hypotheses which consist of bits within the corrected payload portion. This features has two main applications in decoding: (I) Multiple CRC signatures can be used to reduce the false correction probability. Once a CRC match is detected, all associated payload bits are considered reliably decoded, and further iterative decoding effectively includes shorter packets for decoding, since any suggested error vector containing errors in the decoded portion is rejected. (II) Multiple CRC signatures enables partial decoding of a codeword. In NAND flash memories this is useful for short read requests, where a long codeword is used to guarantee highest reliability.

Soft Decoding with CRC Error Detection

According to an embodiment of this invention, the soft decoding flow may include a CRC update for every suspected erroneous bit. The CRC signature is once computed on the decoder input at O(N), and then is updated at O(1) for very suspected error. The main advantage of using a CRC during the soft decoding process for every suspected error-bit is, like in hard decoding, the capability to declare on decode-success without correcting all errors—this is useful in many applications, where the decoding result needed by the application is only the payload, and the decoding can be considered successful despite possible remaining errors in the redundancy.

Figure 10:
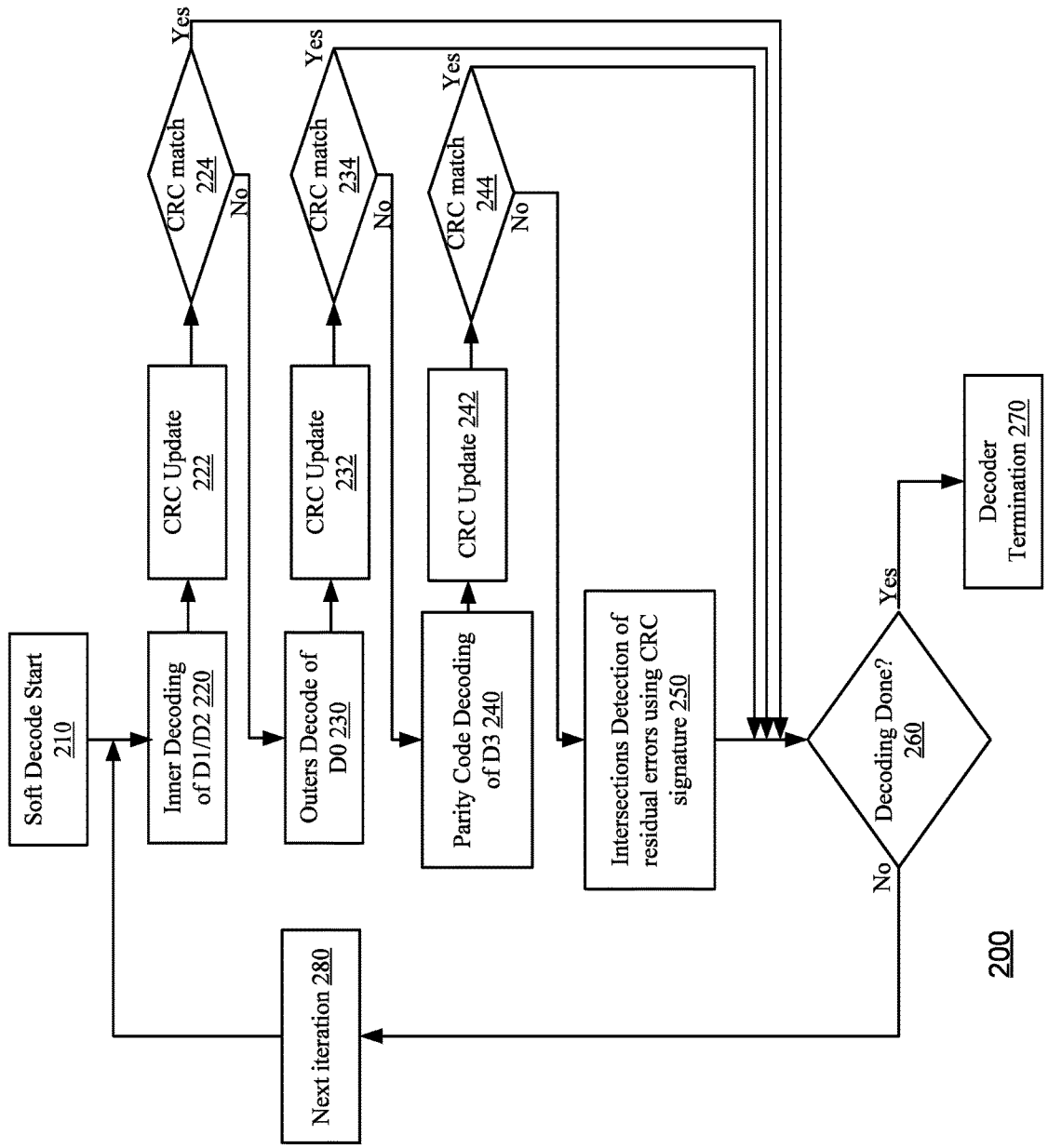
FIG. 10 illustrates a multi-dimensional soft decoding flow, which includes CRC signature update for error detection during decode flow, according to an embodiment of the invention.

Such decoder flow can include a CRC match check for every suspected error bit during the decoding, whether it is during the soft inner decoding iterations or during outer decode, or even during intersections' decoding. FIG. 10 exemplifies a multi-dimensional soft decoding flow, which includes CRC signature update for error detection. As may be noticed, every stage includes a CRC update operation for its associated suspected errors. In case of a CRC match, a decoding termination condition is tested.

FIG. 10 exemplifies a multi-dimensional decoding flow 200, which starts at step 210. Then the process continues to inner packets decoding (of D1 and/or D2) 220, followed by CRC update 222 and step 222 is followed by checking if there is a CRC match 224.

If step 224 finds that there is a CRC match for all of the CRC signatures (or for all CRC signatures that are relevant—the relevancy may be fed to the decoder) then a decoding termination may be tested (step 260 of checking if the decoding is done). If the decoding is done jumping to step 270 of decoder termination. If the decoding is not done jumping to step 280 of performing a next iteration. Step 280 is followed by step 220.

If step 224 finds that there is no CRC match then step 224 is followed by step 230 of performing an outers decoding (outers 230). Step 230 is followed by CRC update 232 and step 232 is followed by checking if there is a CRC match 234.

If step 234 finds that there is a CRC match for all of the CRC signatures (or for all CRC signatures that are relevant—the relevancy may be fed to the decoder) then a decoding termination may be tested (step 260 of checking if the decoding is done). If the decoding is done jumping to step 270 of decoder termination. If the decoding is not done jumping to step 280 of performing a next iteration. Step 280 is followed by step 220.

If step 234 finds that there is no CRC match then step 234 is followed by step 240 of performing parity code decoding of D3. Step 240 is followed by CRC update 242 and step 242 is followed by checking if there is a CRC match 244.

If step 244 finds that there is a CRC match for all of the CRC signatures (or for all CRC signatures that are relevant—the relevancy may be fed to the decoder) then a decoding termination may be tested (step 260 of checking if the decoding is done). If the decoding is done jumping to step 270 of decoder termination. If the decoding is not done jumping to step 280 of performing a next iteration. Step 280 is followed by step 220.

If step 244 finds that there is no CRC match then step 244 is followed by step 250 of intersections detection of residual error using CRC signature.

During step 250 a CRC match may be tested for every bit flip hypothesis (which precedes the solver decoding per code component). This may be done in order to resolve scenarios of multiple redundancy errors, which cannot be solved by the code component decoder and by enumeration over the intersected bits (with other unsolved component codes) with a CRC match test, the remaining errors within the intersection may be resolved. This is why before every solving of a flip hypothesis the CRC match test is used.

It is noted that if during step 220 multiple hypotheses are evaluated then the CRC update 222 and the CRC match 224 may be evaluated for a single hypothesis, per some of the hypotheses or for all of the hypotheses.

According to an embodiment of the invention CRC update 222 and CRC match 224 may be applied for every decoding hypothesis in step 220 (of every packet in current dimension).

It is noted that if during step 230 multiple hypotheses are evaluated then the CRC update 232 and the CRC match 234 may be evaluated for a single hypothesis, per some of the hypotheses or for all of the hypotheses.

It is noted that if during step 240 multiple hypotheses are evaluated then the CRC update 242 and the CRC match 244 may be evaluated for a single hypothesis, per some of the hypotheses or for all of the hypotheses.

According to an embodiment of the invention once the CRC match is found the non-applied hypotheses may be dropped, and the decoding flow may continue to step 260.

According to another embodiment of this invention, during soft decoding of a single packet, the decoder attempts to enumerate on hypotheses according to their likelihood and rank the decoding result solution with a reliability score computed from the suggested decoding solution. During this single packet enumeration and solving, a CRC update is tested for every candidate solution. If a CRC match is found the decoding success condition is tested, and decoding may terminate successfully. This may be especially useful for a NAND Flash memory application which requires a low error floor. In NAND Flash memories the programming might induce errors due to bad cells within a page. In these cases the assigned LLR values might be high due to a non-changing value during the soft sampling. In these cases a packet decoder which seeks the most likely solution out of multiple evaluated candidates might miss the actual error-vector, and end-up with a false correction. The CRC-update and testing for every candidate may help, when most of the packets are solved, to overcome decoder stopping sets.

According to another embodiment of this invention, with only a few unsolved packets in every dimension, the soft decoder performs CRC assisted decoding on intersections. When a few packets are not solved in every dimension, the soft decoder may decide not to perform the usual soft decoding per packet, and instead perform enumeration over the intersecting bits of the unsolved packet. The enumeration over the intersecting bits of unsolved packets includes enumeration of single bit hypotheses, then two bit hypotheses up to N-bit hypotheses. For every hypothesis, no decoder solving is required, only a CRC signature update is required. If a CRC match is found during this enumeration, the decoding success test is done, and possible successful decoder termination is possible The benefit of such approach is (I) A potentially reduced complexity soft decoding during the last few stages, as the complexity of soft decoding for a single packet includes both a bit flip enumeration together with decoder solving per enumeration hypothesis. Here only CRC updates are tested for every hypothesis. (II) A practical approach to overcome programming errors in NAND Flash memories. In case of such hard errors the assigned LLR values might be too high. As these bits are not known apriori, a decoder which does not know in advance the location of hard errors has to deal with errors with high associated LLRs. When there are not too many programming errors, and only a few unsolved packets, it may be beneficial to utilize such a CRC-intersections decoding approach.

Figure 11:
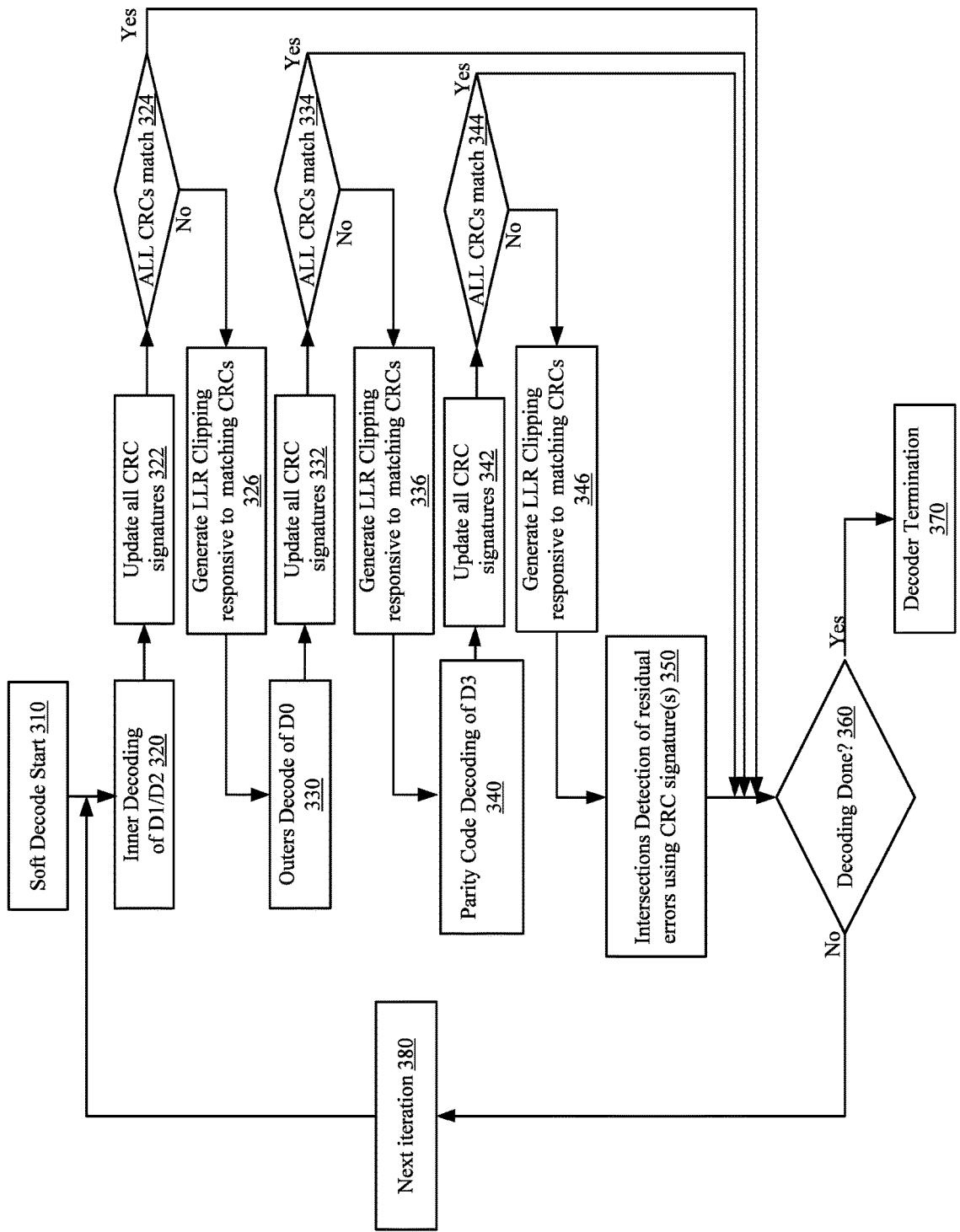
FIG. 11 illustrates a multi-dimensional soft decoding flow, which includes CRC signature update for error detection during decode flow, according to an embodiment of the invention.

According to another embodiment of the invention, a codeword may consist of multiple CRC signatures, on different and non-overlapping parts of the payload. In case there is more than one CRC signature, all CRC signatures are updated during decoding, where every suspected error-bit is associated with another CRC signature to be updated. Then, in case that one of the CRC signatures comparison yields a CRC match, the corresponding part of the payload may be considered corrected. The ongoing decoding process accounts for the decoded payload portion by assigning MAX_LLR values to the corrected bits, which assists in rejecting error hypotheses which consist of bits within the corrected payload portion. It is beneficial to use multiple CRC signatures in order to reduce the false correction probability. Once a CRC match is detected, all associated payload bits are considered reliably decoded, and further iterative decoding effectively includes shorted packets for decoding, since any suggested error vector containing errors in the decoded portion is rejected. FIG. 11 demonstrates a multi-dimensional iterative soft decoding flow with multiple CRC signatures which are tested on-the-fly during evaluation of every error hypothesis, and every time another CRC match is found, all the payload bits associated with the decoded CRC are assigned highest LLR values (which guarantees they will not take part in any correction hypothesis).

FIG. 11 exemplifies a multi-dimensional decoding flow 300, which starts at step 310. Then the process continues to inner packets decoding (of D1 and/or D2) 320, followed by CRC update 322 and step 322 is followed by checking if there is a CRC match 324.

If step 324 finds that there is a CRC match for all of the CRC signatures (or for all CRC signatures that are relevant—the relevancy may be fed to the decoder) then a decoding termination may be tested (step 360 of checking if the decoding is done). If the decoding is done jumping to step 370 of decoder termination. If the decoding is not done jumping to step 380 of performing a next iteration. Step 380 is followed by step 320.

If step 324 finds that there is no CRC match then step 324 is followed by step 326 of generating LLR clipping responsive to matching CRC signatures 326—thereby increasing the reliabilities of bits that belong to data segments that were validated during the CRC check and/or reducing the reliabilities of bits that belong to data segments that were invalidated during the CRC check.

Step 326 may be followed by step 330 of performing an outers decoding (outers 330). Step 330 is followed by CRC update 332 and step 332 is followed by checking if there is a CRC match 334.

If step 334 finds that there is a CRC match for all of the CRC signatures (or for all CRC signatures that are relevant—the relevancy may be fed to the decoder) then a decoding termination may be tested (step 360 of checking if the decoding is done). If the decoding is done jumping to step 370 of decoder termination. If the decoding is not done jumping to step 380 of performing a next iteration. Step 380 is followed by step 320.

If step 334 finds that there is no CRC match then step 334 is followed by step 336 of generating LLR clipping responsive to matching CRC signatures 336—thereby increasing the reliabilities of bits that belong to data segments that were validated during the CRC check and/or reducing the reliabilities of bits that belong to data segments that were invalidated during the CRC check.

Step 336 may be followed by step 340 of performing parity code decoding of D3. Step 340 is followed by CRC update 342 and step 342 is followed by checking if there is a CRC match 344.

If step 344 finds that there is a CRC match for all of the CRC signatures (or for all CRC signatures that are relevant—the relevancy may be fed to the decoder) then a decoding termination may be tested (step 360 of checking if the decoding is done). If the decoding is done jumping to step 370 of decoder termination. If the decoding is not done jumping to step 380 of performing a next iteration. Step 380 is followed by step 320.

If step 344 finds that there is no CRC match then step 344 is followed by step 346 of generating LLR clipping responsive to matching CRC signatures 346—thereby increasing the reliabilities of bits that belong to data segments that were validated during the CRC check and/or reducing the reliabilities of bits that belong to data segments that were invalidated during the CRC check.

Step 346 may be followed by step 350 of intersections detection of residual error using CRC signature.

During step 350 a CRC match may be tested for every bit flip hypothesis (which precedes the solver decoding per code component). This may be done in order to resolve scenarios of multiple redundancy errors, which cannot be solved by the code component decoder and by enumeration over the intersected bits (with other unsolved component codes) with a CRC match test, the remaining errors within the intersection may be resolved. This is why before every solving of a flip hypothesis the CRC match test is used.

It is noted that if during step 320 multiple hypotheses are evaluated then the CRC update 322 and the CRC match 324 may be evaluated for a single hypothesis, per some of the hypotheses or for all of the hypotheses.

It is noted that if during step 330 multiple hypotheses are evaluated then the CRC update 332 and the CRC match 334 may be evaluated for a single hypothesis, per some of the hypotheses or for all of the hypotheses.

It is noted that if during step 340 multiple hypotheses are evaluated then the CRC update 342 and the CRC match 344 may be evaluated for a single hypothesis, per some of the hypotheses or for all of the hypotheses.

The mentioned above methods may uses of CRC checks during the decoding process, to be able to declare on decode-success without correcting all errors—mainly useful in systematic codes, where the decoding result is the payload, and the redundancy is not required after decoding.

For hard decoding: (I) During intersections decoding, the flipping of bits within intersections is done alongside with CRC check for every flip, this is even though the flipped bits might not solve the corresponding packets (due to errors in the redundancy). (II) Same for plurality intersections—may be more than one intersection. (III) With multiple CRC signatures on same codeword—use forcing of bits' state to avoid false corrections of unsolved packets. One CRC OK while other no—can change the bits accordingly and not allow corrections of these bits during further iterations. (IV) CRC is tested during intersections decoding for every bit flip, before and after applying the solver decoding per packet, so as to overcome false corrections.

Soft decoding: (I) When there are only a few unsolved packets, there is high probability to have errors within the intersecting bits between unsolved packets of different dimensions. Therefore, it can be effective to enumerate over suspected bits until the CRC is cleared. (Note—unlike hard decoding it is not required to use the solver in this decoding method). Instead of preventing correction—assign high reliabilty. (II) During soft enumeration, the CRC can be checked for every hypothesis before and after solving the codeword. In soft decoding, a list of candidates with lowest reliability are considered for decoding (additional bit flips), for every candidate a decoder solving is attempted. According to this invention, for every bit flip of the candidates and every suggested decoder solution the CRC state is tested—thus even solutions which are not the most likely solution, or bit flips for which there is not decoder solution (due to, for example, redundancy errors for example) can be found as solutions of the whole codeword. Early termination of decoding based upon CRC The suggested methods allow efficient soft decoding in presence of NAND Flash memory programming errors, which result in high LLR assignment to erronous bits. The CRC check during enumeration may overcome this limitation by enumerating over error hypotheses in a small set of unsolved bits, which are located in the intersection of the unsolved packets of different dimensions. IF CRC match not enoug—see number of solved component codes (packets=such as ¼ of multi-dimension)—whether exceeds threshold. If zeroed many CRC but many code components are still wrong—not good enough.

To have a reliable decoding (sufficiently low miss-detection) when CRC is cleared, the decoder checks whether there are enough solved packets (component codes)—the indication for solved component codes is a zero-syndrome per packet.

After every bit flip in decoding, the CRC is updated—if the CRC cleared, the decoding can declare success even when not all packets are solved (some syndromes might not be zero), due to redundancy errors which need not be corrected for providing a corrected output.

Multiple CRC signatures, on different parts of the payload, can allow parallel updating of CRC, thus achieve faster solving. Can also be used for forcing LLR and hard bits states, and assist in decoding of other parts of codewords for which CRC is not clear.

Multiple signatures can be used on several codewords separately, without overlapping, or on overlapping packets (part of the data for all packets in every dimension).

Figure 12:
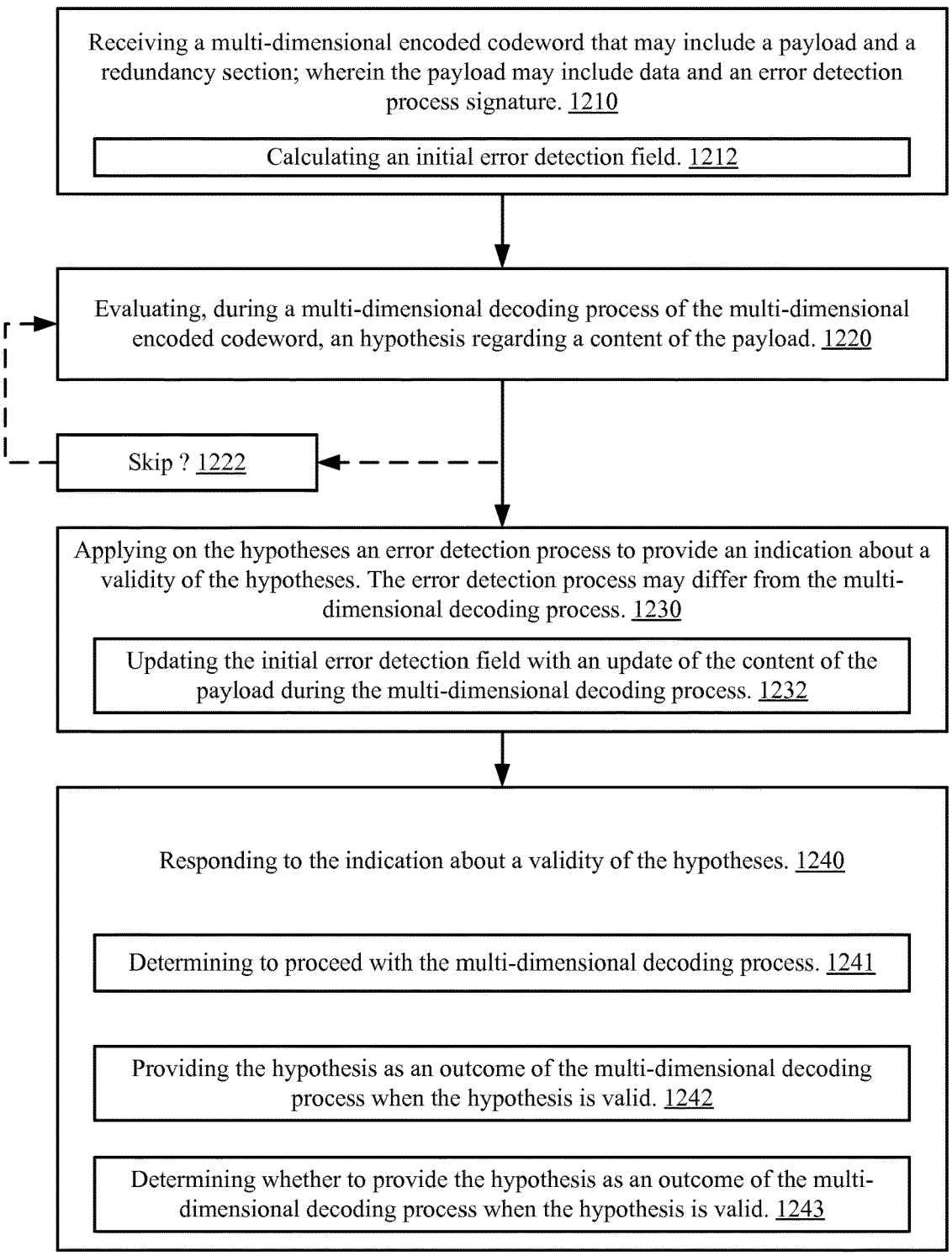
FIG. 12 illustrates a method according to an embodiment of the invention.

FIG. 12 illustrates method 1200 according to an embodiment of the invention.

Method 1200 may start by step 1210 of receiving a multi-dimensional encoded codeword that may include a payload and a redundancy section; wherein the payload may include data and an error detection process signature.

Step 1210 may be followed by step 1220 of evaluating, during a multi-dimensional decoding process of the multi-dimensional encoded codeword, an hypothesis regarding a content of the payload.

The hypothesis may be generated during a soft decoding process, during a hard decoding process, during a list decoding, during an intersection decoding, during a decoding of any dimension of a multi-dimensional decoding process and the like. The hypothesis may refer to the entire payload or to any part of the payload—including one or more bits of the payload.

Non-limiting examples of multi-dimensional decoding process during which a hypothesis can be evaluated are included in U.S. Pat. Nos. 8,341,502, 8,700,970, 8,510,639, 8,458,574, 8,621,321, 8,850,297, U.S. patent application Ser. Nos. 14/293,721, 14/049,070, 14/049,547 and 13/917,069, all being encorporated herein by reference.

It is noted that during the multi-dimensional decoding process multiple (Q) hypotheses regarding the content of the payload may be evaluated. One, a majority or all of the these Q hypotheses may be validated by step 1230.

Step 1220 may be followed by step 1230 of applying on the hypotheses an error detection process to provide an indication about a validity of the hypotheses. The error detection process may differ from the multi-dimensional decoding process.

Step 1230 may be followed by step 1240 of responding to the indication about a validity of the hypotheses.

Step 1240 may include determining (1241) to proceed with the multi-dimensional decoding process jumping to step 1220 during which a next hypothesis is evaluated. Step 1241 may include determining to proceed with the multi-dimensional decoding process when the hypothesis is invalid.

Step 1240 may include providing (1242) the hypothesis as an outcome of the multi-dimensional decoding process when the hypothesis is valid.

Step 1240 may include determining (1243) whether to provide the hypothesis as an outcome of the multi-dimensional decoding process when the hypothesis is valid.

Step 1243 may be responsive to a number of resolved (or un resolved) code components of the multiple code components that are associated with a dimension of the multi-dimensional decoding process. The hypothesis regarding the content of the payload is evaluated during a decoding of a code component of that dimension of the multi-dimensional decoding process. Multiple code components are associated with the dimension. For example—if less than a predefined number of code components of the dimension are unresolved code components then step 1243 may include determining to provide the hypothesis as an outcome of the multi-dimensional decoding process.

The error detection process may be a cyclic redundancy check (CRC) process.

Step 1210 may be followed by step 1212 of calculating an initial error detection field.

Step 1220 may include updating the initial error detection field with an update of the content of the payload during the multi-dimensional decoding process.

Step 1220 may be followed by step 1222 of determining whether to proceed to step 1230. For example, step 1222 may include determining to skip step 1230 and jumping to step 1220 during which a next hypothesis is evaluated.

Figure 13:
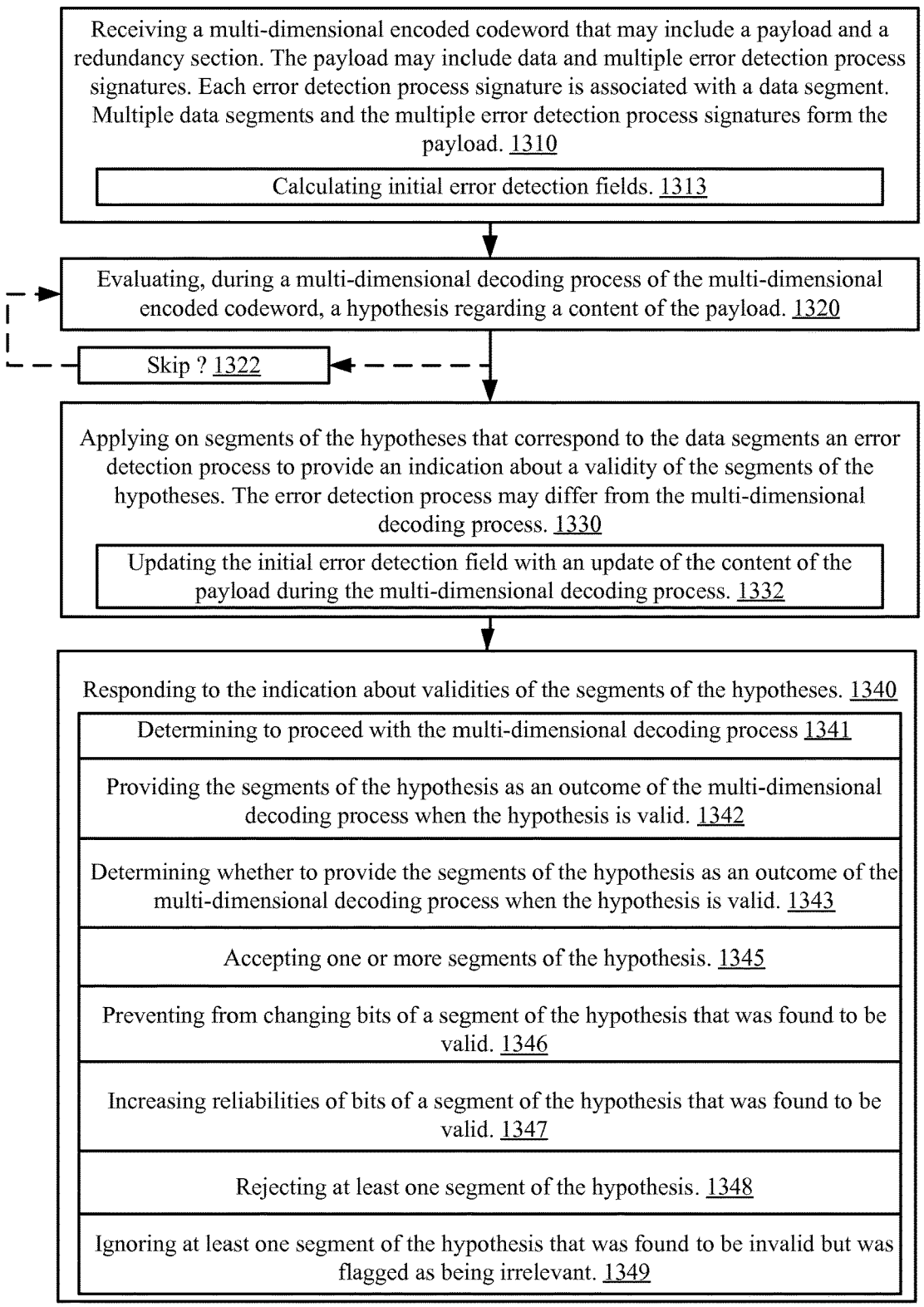
FIG. 13 illustrates a method according to an embodiment of the invention.

FIG. 13 illustrates method 1300 according to an embodiment of the invention.

Method 1300 may start by step 1310 of receiving a multi-dimensional encoded codeword that may include a payload and a redundancy section. The payload may include data and multiple error detection process signatures. Each error detection process signature is associated with a data segment. Multiple data segments and the multiple error detection process signatures form the payload.

Step 1310 may be followed by step 1320 of evaluating, during a multi-dimensional decoding process of the multi-dimensional encoded codeword, a hypothesis regarding a content of the payload.

It is noted that during the multi-dimensional decoding process multiple (Q) hypothesis regarding the content of the payload may be evaluated. One, a majority or all of the these Q hypotheses may be validated by step 1330.

The hypothesis may be generated during a soft decoding process, during a hard decoding process, during a list decoding, during an intersection decoding, during a decoding of any dimension of a multi-dimensional decoding process and the like.

Non-limiting examples of multi-dimensional decoding process during which a hypothesis can be evaluated are included in U.S. Pat. Nos. 8,341,502, 8,700,970, 8,510,639, 8,458,574, 8,621,321, 8,850,297, U.S. patent application Ser. Nos. 14/293,721, 14/049,070, 14/049,547 and 13/917,069, all being encorporated herein by reference.

Step 1320 may be followed by step 1330 of applying on segments of the hypotheses that correspond to the data segments an error detection process to provide an indication about a validity of the segments of the hypotheses. The error detection process may differ from the multi-dimensional decoding process.

Step 1330 may be followed by step 1340 of responding to the indication about validities of the segments of the hypotheses.

Step 1340 may include determining (1341) to proceed with the multi-dimensional decoding process jumping to step 1320 during which a next hypothesis is evaluated. Step 1341 may include determining to proceed with the multi-dimensional decoding process when the hypothesis is invalid.

Step 1340 may include providing (1342) the segments of the hypothesis as an outcome of the multi-dimensional decoding process when the hypothesis is valid.

Step 1340 may include determining (1343) whether to provide the segments of the hypothesis as an outcome of the multi-dimensional decoding process when the hypothesis is valid.

Step 1343 may be responsive to a number of unresolved code components of the multiple code components that are associated with a dimension of the multi-dimensional decoding process. The segments of the hypothesis regarding the content of payload is evaluated during a decoding of a code component of that dimension of the multi-dimensional decoding process. Multiple code components are associated with the dimension. For example—if less than a predefined number of code components of the dimension are unresolved code components then step 1343 may include determining to provide the hypothesis as an outcome of the multi-dimensional decoding process.

The error detection process may be a cyclic redundancy check (CRC) process.

Step 1340 may include accepting (1345) one or more segments of the hypothesis.

Step 1340 may include preventing (1346) from changing bits of a segment of the hypothesis that was found to be valid.

Step 1340 may include increasing (1347) reliabilities of bits of a segment of the hypothesis that was found to be valid.

Step 1340 may include rejecting (1348) at least one segment of the hypothesis.

Step 1340 may include ignoring (1349) at least one segment of the hypothesis that was found to be invalid but was flagged as being irrelevant.

Step 1310 may be followed by step 1312 of calculating an initial error detection field.

Step 1320 may include updating the initial error detection field with an update of the content of the payload during the multi-dimensional decoding process.

Step 1320 may be followed by step 1322 of determining whether to proceed to step 1330. For example, step 1322 may include determining to skip step 1330 and jumping to step 1320 during which a next hypothesis is evaluated.

Once a payload segment was found to be valid, step 1340 may include rejecting a hypothesis regarding the content of the payload when the hypothesis conflicts (suggests another value) with a content of the data segment after finding that the data segment is valid.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for multi-dimensional decoding, the method comprising:

receiving, at a decoder circuit, a multi-dimensional encoded codeword that comprises a payload and a redundancy section; wherein the payload comprises data and an error detection process signature;

applying, with the decoder circuit, during a multi-dimensional decoding process of the multi-dimensional encoded codeword, a hypothesis to a content of the payload;

applying to the hypothesis, with the decoder circuit, an error detection process to provide an indication about a validity of the hypothesis; and enabling the decoder circuit to proceed with the multi-dimensional decoding process and find a second hypothesis to be error detection process validated when the hypothesis is invalid based on the application of the hypothesis to the error detection process, wherein the hypothesis applied to the content of the payload is obtained by flipping a bit of a code component;

wherein the code component is associated with a dimension of the multi-dimensional decoding process;

wherein an intersection between the code component and at least one further code component of at least one further dimension comprises a shared bit; and wherein the code component and the further code component were flagged as being erroneous before flipping the shared bit of the intersection.

2. The method according to claim 1 further comprising providing the hypothesis as an outcome of the multi-dimensional decoding process when the hypothesis is valid.

3. The method according to claim 1 further comprising determining whether to provide the hypothesis as an outcome of the multi-dimensional decoding process when the hypothesis is valid.

4. The method according to claim 1 wherein the error detection process is a cyclic redundancy check (CRC) process.

5. The method according to claim 1 further comprising calculating an initial error detection field process of the payload; and updating the initial error detection field with an update of the content of the payload during the multi-dimensional decoding process.

6. The method according to claim 1 further comprising skipping an applying of an error detection process on the hypothesis when the multi-dimensional decoding process indicates that a content of a payload associated with the hypothesis includes mis-corrected bits.

7. The method according to claim 1 wherein the multi-dimensional decoding process comprises soft decoding.

8. The method according to claim 1 further comprising applying on a majority of hypotheses evaluated during the multi-dimensional decoding process, the error detection process to provide indications about validities of the majority of the hypotheses.

9. The method according to claim 1 wherein the multi-dimensional decoding process comprises hard decoding.

10. The method according to claim 1 wherein the payload comprises multiple error detection process signatures and multiple data segments; wherein each data segment is associated with an error detection process signature.

11. The method according to claim 10 further comprising preventing a change of bits of a data segment after applying the error detection process on the data segment and finding that the data segment is valid.

12. The method according to claim 10 further comprising rejecting the hypothesis regarding the content of the payload when the hypothesis conflicts with a content of the data segment after finding that the data segment is valid.

13. The method according to claim 10 further comprising increasing a reliability score of bits of a data segment after applying the error detection process on the data segment and finding that the data segment is valid.

14. The method according to claim 13 further comprising receiving an instruction to ignore an invalidity of a certain data segment; and determining to provide the hypothesis as the outcome of the multi-dimensional decoding process when payload segments that differ from the certain data segment are valid.

15. The method according to claim 10 further comprising receiving an instruction to ignore invalidity of a certain data segment; and determining whether to provide the hypothesis as the outcome of the multi-dimensional decoding process when payload segments that differ from the certain data segment are valid.

16. The method according to claim 10 further comprising receiving an instruction to respond to a validity of only certain data segments; and determining to provide the hypothesis as the outcome of the multi-dimensional decoding process when the certain payloads segments are valid.

17. A non-transitory computer readable medium that stores instructions that once executed by a flash memory controller cause the flash memory controller to receive a multi-dimensional encoded codeword that comprises a payload and a redundancy section; wherein the payload comprises data and an error detection process signature;

apply, during a multi-dimensional decoding process of the multi-dimensional encoded codeword, a hypothesis to a content of the payload;

apply the hypothesis to an error detection process to provide an indication about a validity of the hypothesis;

proceed with the multi-dimensional decoding process and find a second hypothesis to be error detection process validated when the hypothesis is invalid based on the application of the hypothesis to the error detection process; and determine whether to provide the hypothesis as an outcome of the multi-dimensional decoding process when the hypothesis is valid;

wherein the hypothesis applied to the content of the payload is evaluated during a decoding of a code component of a dimension of the multi-dimensional decoding process;

wherein multiple code components are associated with the dimension of the multi-dimensional decoding process; and wherein the determining of whether to provide the hypothesis as the outcome of the multi-dimensional decoding is dependent on a number of resolved code components of the multiple code components.

18. A flash memory controller comprising a memory and a processor, wherein the memory is configured to store a multi-dimensional encoded codeword that comprises a payload and a redundancy section; wherein the payload comprises data and an error detection process signature; wherein the processor is configured to apply, during a multi-dimensional decoding process of the multi-dimensional encoded codeword, a hypothesis to a content of the payload;

apply, the hypothesis to an error detection process to provide an indication about a validity of the hypothesis;

proceed with the multi-dimensional decoding process and find a second hypothesis to be error detection process validated when the hypothesis is invalid based on the application of the hypothesis to the error detection process; and determine whether to provide the hypothesis as an outcome of the multi-dimensional decoding process when the hypothesis is valid;

wherein the hypothesis applied to the content of the payload is evaluated during a decoding of a code component of a dimension of the multi-dimensional decoding process;

wherein multiple code components are associated with the dimension; and wherein the determining of whether to provide the hypothesis as the outcome of the multi-dimensional decoding is dependent on a number of resolved code components of the multiple code components.

* * * * *